United States Patent
Huang

(10) Patent No.: US 7,030,492 B2
(45) Date of Patent: Apr. 18, 2006

(54) UNDER BUMP METALLURGIC LAYER

(75) Inventor: Min-Lung Huang, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 0 days.

(21) Appl. No.: 10/710,422

(22) Filed: Jul. 9, 2004

(65) Prior Publication Data
US 2005/0029677 A1    Feb. 10, 2005

(30) Foreign Application Priority Data
Aug. 7, 2003   (TW) .............................. 92121599 A

(51) Int. Cl.
*H01L 23/48* (2006.01)
*H01L 29/40* (2006.01)

(52) U.S. Cl. ............... 257/738; 257/767; 257/778; 257/779

(58) Field of Classification Search ................ 257/738, 257/767, 737, 736, 778, 779
See application file for complete search history.

(56) References Cited

U.S. PATENT DOCUMENTS

| | | | |
|---|---|---|---|
| 6,249,044 B1 * | 6/2001 | Kao et al. ................. | 257/678 |
| 6,452,270 B1 * | 9/2002 | Huang ..................... | 257/738 |
| 6,462,426 B1 * | 10/2002 | Kelkar et al. ........... | 257/781 |

* cited by examiner

*Primary Examiner*—Jerome Jackson
*Assistant Examiner*—Joseph Nguyen
(74) *Attorney, Agent, or Firm*—Jiang Chyun IP Office

(57) ABSTRACT

An under bump metallurgic (UBM) layer which is adapted for a chip is disclosed. The UMM layer alleviate the loss of electromigration resulting from current crowing effect at the corner of UBM layer near the transmission line. By increasing the thickness of the UBM layer at the particular region which is close to the transmission line, losses of the UBM layer due to electromigration can be compensated. The life time of the chip is, therefore, enhanced.

8 Claims, 1 Drawing Sheet

UNDER BUMP METALLURGIC LAYER

CROSS REFERENCE TO RELATED APPLICATIONS

This application claims the priority benefit of Taiwan application serial No. 92121599, filed on Aug. 7, 2003.

BACKGROUND OF INVENTION

1. Field of the Invention

The present invention relates to an under bump metallurgic (UBM) layer, and more particularly to an improved structure of a UBM layer with less electromigration loss.

2. Description of the Related Art

For semiconductor industry, the manufacturing of integrated circuits comprises three main stages: fabrication of wafers, fabrication of integrated circuits and package of the integrated circuits. Dies are obtained by sawing wafers on which circuits are designed and manufactured. The dies connect external circuits via bonding pads thereon. The dies then are packaged so that the dies are protected from the influences of moisture, heat and noises. For the dies with packages, the package of the die acts as the medium for electrically connecting external circuits, such as printed circuit board (PCB) or other package substrate boards. Accordingly, the package of the dies and the integrated circuits is completed.

In order to connect the dies and the package substrate, wires and/or conductive bumps are often applied. In the Flip Chip Interconnect Technology (FCIT), an array of conductive bumps is formed on the boding pads of the dies. Then the dies are flipped so as to connect the conductive bumps to the contacts of the package substrate. Accordingly, the dies are electrically connected to the package substrate via the conductive bumps, and electrically connected to the external circuits via the internal circuits and the contacts of the package substrate.

FIG. 1 is a schematic cross sectional view of the structure of a prior art UBM layer. The passivation layer 104 is formed on the active surface 102 of the chip 100. The passivation layer 104 covers the active surface 102 of the chip 100. An opening 106 is formed in the passivation layer 104 and exposes the top surface 112 of the bonding pad 110, serving as a contact window for subsequent bumping process. The UBM layer 120 and a conductive bump are formed on the bonding pad 110 by the bumping process. The UBM layer 120 is formed between the top surface 112 of the bonding pad 110 and the conductive bump 130 for enhancing the adhesion between the bonding pad 110 and the conductive bump 130. The material of the conductive bump 130 can be a solder material such as Sn—Pb. The spherical bump can be formed by a reflow process.

It is noted that the UBM layer is formed substantially conformally to the structure of the opening 106, covering the top surface 112 of the bonding pad 110 and the surface surrounding the opening 106. During operation of the chip 100, large currents flow through the UBM layer 120, resulting in high current density at the region 108 close to the transmission line 114. Due to current crowding in the region 108 of the UBM layer 120, metal atoms diffuse along the electron flowing direction at the lattice boundary of this region 108. This phenomenon is called electromigration. Electromigration causes losses of metal atoms of the UBM layer 120. This electromigration phenomenon is more serious at the portion which is close to the transmission line 114 than the other portion which is away from the transmission line 114, which reduces the life time of the chip 100.

SUMMARY OF INVENTION

Accordingly, the present invention is directed to an improved structure of an under bump metallurgic (UBM) layer. By increasing the thickness of the UBM layer which is close to the transmission line, the chip with such UBM layer becomes more reliable.

In order to achieve the object described above, the present invention discloses a UBM layer which is adapted for a chip. The chip comprises at least a bonding pad and a transmission line coupled thereto. By increasing the thickness of the UBM layer which is close to the transmission line, losses of the UBM layer resulting from electromigration can be compensated by the increased thickness of the UBM layer. The life time of the chip is, therefore, enhanced.

According to one embodiment of the present invention, the UBM layer comprises a plurality of metal layers and at least one liner layer. The liner layer is disposed among the metal layers and close to an end of the transmission line coupled to the bonding pad. In addition, the UBM layer may comprise a plurality of metal layers of which portions close to the transmission line are thicker than the other portions that are away from the transmission line.

The above and other features of the present invention will be better understood from the following detailed description of the preferred embodiments of the invention that is provided in connection with the accompanying drawings.

DETAILED DESCRIPTION

Figure 1:
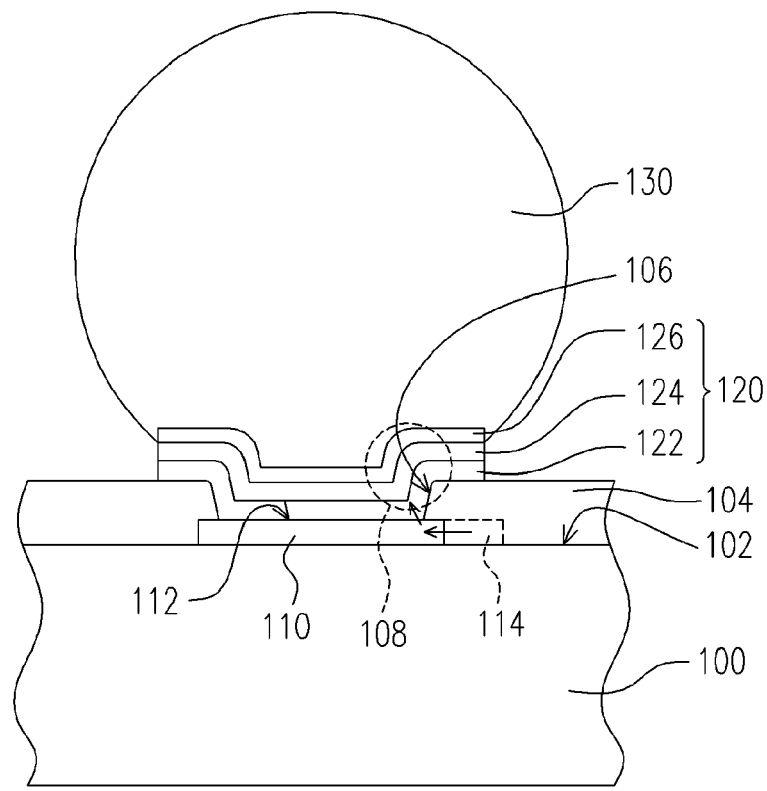
FIG. 1 is a schematic cross sectional view of the structure of a prior art UBM layer.
Figure 2:
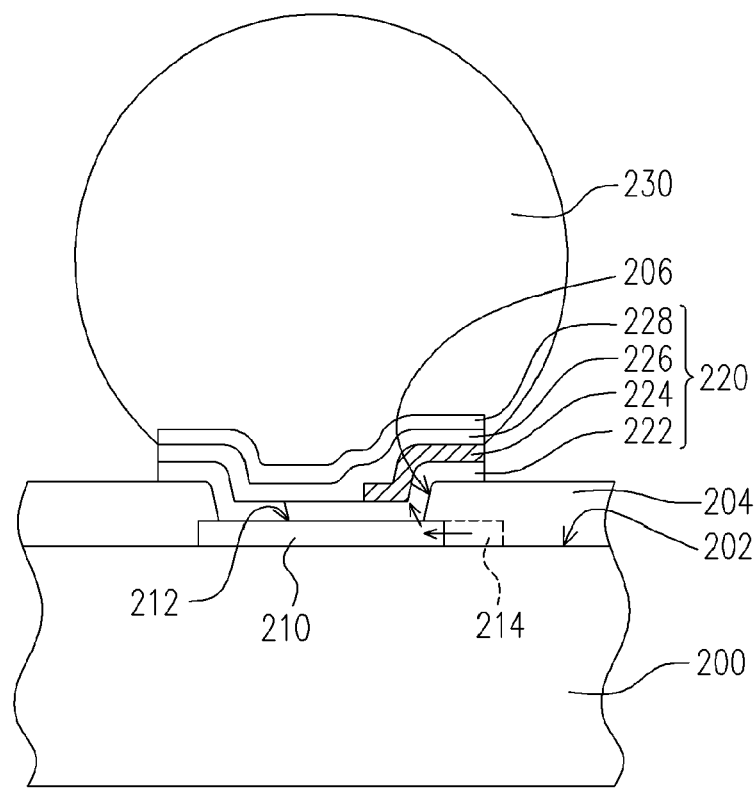
FIG. 2 is a schematic cross sectional view of the structure of an under bump metal (UBM) layer according to one embodiment of the present invention.

FIG. 2 is a schematic cross sectional view of the structure of an under bump metal (UBM) layer according to one embodiment of the present invention. In this embodiment, the UBM layer 220 comprises, for example, a first metal layer 222, a liner layer 224, a second metal layer 226 and a third metal layer 228. The liner layer 224 is disposed among any two adjacent metal layers. For example, the liner layer 224 can be disposed between the first metal layer 222 and the second metal layer 226, or between the second metal layer 226 and the third metal layer 228. The metal layers 222, 226 and 228 may function as an adhesive layer, a barrier layer and a wetting layer, respectively. The metal layers can be formed by sequential deposition. A passivation layer 204 is formed on the active surface 202 of the chip 200. The material of the passivation layer 204 can be an organic passivation material or an inorganic passivation material by a deposition process, for example. The passivation layer 204 covers the active surface 202 of the chip 200. The passivation layer 204 protects the transmission line 214 of the chip 200. One end of the transmission line 214 is coupled to the bonding pad 210. An opening 206 is formed in the passivation layer 204 and exposes the top surface 212 of the bonding pad 210, serving as a contact window for the subsequent bumping process.

Referring to FIG. 2, the first metal layer 222 is formed substantially conformally to the profile of the opening 206 and covering the top surface 212 of the bonding pad 210 and a portion of the surface of the passivation layer surrounding the opening 206. According to this embodiment the liner layer 224 is formed between the first and second metal layers 222, 226 and is disposed on a portion of the top surface of the first metal layer 222 which is close to the transmission line 214. The second metal layer 226 covers the other portion of the top surface of the first metal layer 222 which is away from the transmission line 214. For the region of the UBM layer 220 which is close to the transmission line 214, the liner layer 224 increases the total thickness of the region. By increasing the thickness of the UBM layer 220 in the particular region which is close to the transmission line 214, losses of the UBM layer 220 resulting from electromigration can be compensated. The life time of the chip 200 is, therefore, enhanced.

In this embodiment, the material of the first metal layer 222 can be Al, Ti, W or an alloy thereof, for example. The liner layer 224 can be made of or include the same material as that of the first metal layer 222 for increasing the thickness of the first metal layer 222 at the region which is close to the transmission line 214. The material of the second metal layer 226 can be Cr, Ni or an alloy thereof, for example. According to another embodiment, the liner layer 224 can be made of or include the same material as that of the second metal layer 226. The liner layer 224 increases the thickness of the second metal layer 226 at the region which is close to the transmission line 214. The disposition of the liner layer 224 can be arranged to increase the thickness of the first metal layer 222, the second metal layer 226, or the both. Accordingly, the portion of the UBM layer 220 close to the transmission line 214 is thicker than the other portion of the UBM layer 220 that is far away from the transmission line 214. By increasing the thickness of the UBM layer 220 at the region which is close to the transmission line 214, losses of the UBM layer 220 due to electromigration occurring on the UBM layer 220 can be compensated. The life time of the chip 200 is, therefore, enhanced.

In addition, the third metal layer can be, for example, a wetting layer which comprises material such as Ni, Au, Cu or an alloy thereof. The third metal layer 228 is formed over the second metal layer 226. The conductive bump 230 adheres to the third metal layer 228 and electrically connects to the bonding pad 210, as a conductive structure of the chip 200 for external connection. The liner layer 224 is not limited to a single layer. One or more liner layers may be disposed within the UBM layer 220, For example the liner layer may be disposed between the second metal layer 226 and the third metal layer 228, on the third metal layer 228, or under the first metal layer 222. As long as the liner layer or liner layers enhance the thickness of the UBM layer at the region which is close to the transmission line.

Accordingly, the UBM layer of the present invention can be adapted for a chip and to prevent electromigration occurring on the UBM layer. The improved UBM structure can be achieved by forming one or more liner layers in the UBM layer or increasing the thickness of any metal layers of the UBM layer, at the region of the UBM layer which is close to the transmission line. By increasing the thickness of the UBM layer at the region which is close to the transmission line, losses of the UBM layer due to electromigration occurring on the UBM layer can be compensated. The life time of the chip is, therefore, enhanced.

Although the present invention has been described in terms of exemplary embodiments, it is not limited thereto. Rather, the appended claims should be constructed broadly to include other variants and embodiments of the invention which may be made by those skilled in the field of this art without departing from the scope and range of equivalents of the invention.

The invention claimed is:

1. An under bump metallurgic (UBM) layer adapted for a chip, the chip comprising a bonding pad and a transmission line coupled thereto, wherein the UBM layer is formed over the bonding pad and the UBM layer comprises a plurality of metal layers and at least one liner layer, and the liner layer is formed among the metal layers, wherein the liner layer is formed only close to an end of the transmission line which is connected to the bonding pad such that a portion of the UBM layer which is close to the transmission line is thicker than a portion of the UBM layer which is away from the transmission line.

2. The UBM layer of claim 1, wherein the liner layer comprises a material the same as a material of at least one of the metal layers.

3. The UBM layer of claim 1, wherein a material of the UBM layer is selected from the group consisting of Al, Ti, W, Cr, Ni, Cu, Au, and an alloy thereof.

4. A conductive structure over a bonding pad, adapted for a chip, the chip comprising the bonding pad and a transmission line coupled thereto, the conductive structure comprising:

an under bump metallurgical (UBM) layer formed over the bonding pad, wherein the UBM layer comprises a plurality of metal layers, and only a portion of one of the metal layers at a region which is close to the transmission line is thicker than a remaining portion of the one of the metal layers which is away from the transmission line such that a portion of the UBM layer which is close to the transmission line is thicker than a portion of the UBM layer which is away from the transmission line; and a conductive bump, wherein a bottom of the conductive bump is connected to the UBM layer.

5. The conductive structure of claim 4, wherein a material of the UBM layer is selected from the group consisting of Al, Ti, W, Cr, Ni, Cu, Au, and an alloy thereof.

6. The conductive structure of claim 4, wherein the conductive bump comprises a Sn—Pb alloy.

7. An under bump metallurgic (UBM) layer adapted for a chip, the chip comprising a banding pad and a transmission line coupled thereto, wherein the UBM layer is formed over the bonding pad and the UBM layer comprises a plurality of metal layers, and only a portion of one of the metal layers at a region which is close to the transmission line is thicker than a remaining portion of the one of the metal layers which is away from the transmission line such that a portion of the UBM layer which is close to the transmission line is thicker than a portion of the UBM layer which is away from the transmission line.

8. The UBM layer of claim 7, wherein a material of the UBM layer is selected from the group consisting of Al, Ti, W, Cr, Ni, Cu, Au, and an alloy thereof.

* * * * *